(12) United States Patent
Lee et al.

(10) Patent No.: US 9,444,019 B1
(45) Date of Patent: Sep. 13, 2016

(54) METHOD FOR REUSING A SUBSTRATE FOR MAKING LIGHT-EMITTING DEVICE

(71) Applicant: EPISTAR CORPORATION, Hsinchu (TW)

(72) Inventors: Shih-Chang Lee, Hsinchu (TW); Rong-Ren Lee, Hsinchu (TW); Meng-Yang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/859,739

(22) Filed: Sep. 21, 2015

(51) Int. Cl.
| | | |
|---|---|---|
| *H01L 21/30* | (2006.01) | |
| *H01L 33/44* | (2010.01) | |
| *H01L 33/06* | (2010.01) | |
| *H01L 33/12* | (2010.01) | |
| *H01L 33/30* | (2010.01) | |
| *H01L 33/00* | (2010.01) | |

(52) U.S. Cl.
CPC ......... *H01L 33/44* (2013.01); *H01L 33/0079* (2013.01); *H01L 33/06* (2013.01); *H01L 33/12* (2013.01); *H01L 33/30* (2013.01)

(58) Field of Classification Search
CPC ... H01L 33/44; H01L 33/0079; H01L 33/06; H01L 33/12; H01L 33/30
USPC .................. 438/455, 458, 459, 464
See application file for complete search history.

(56) References Cited

U.S. PATENT DOCUMENTS

| | | | | |
|---|---|---|---|---|
| 7,732,301 | B1 * | 6/2010 | Pinnington | ......... H01L 21/2654 257/E21.097 |
| 2006/0054900 | A1 | 3/2006 | Takamoto et al. | |
| 2007/0287273 | A1 * | 12/2007 | Boussagol | .............. C30B 25/18 438/503 |
| 2009/0269906 | A1 * | 10/2009 | Kato | ................. H01L 21/02532 438/458 |
| 2010/0295083 | A1 * | 11/2010 | Celler | .................... G02B 6/132 257/98 |
| 2011/0053347 | A1 * | 3/2011 | Shimomura | ...... H01L 21/76254 438/458 |
| 2013/0292691 | A1 * | 11/2013 | Henley | ................... H01L 21/78 257/76 |

FOREIGN PATENT DOCUMENTS

CN        103346079 A       10/2013

\* cited by examiner

*Primary Examiner* — Kevin M Picardat
(74) *Attorney, Agent, or Firm* — Patterson + Sheridan, LLP

(57) ABSTRACT

A method for making a light-emitting device is provided. The method comprises the steps of providing a substrate, forming a nucleation layer on the substrate, forming a semiconductor stack on the nucleation layer, and separating the semiconductor stack from the nucleation layer to expose the nucleation layer.

20 Claims, 5 Drawing Sheets

METHOD FOR REUSING A SUBSTRATE FOR MAKING LIGHT-EMITTING DEVICE

TECHNICAL FIELD

The disclosure relates to a method for making a light-emitting device, and particularly to a method for making a light-emitting device with a reusable substrate.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime. Therefore, LEDs gradually replace the conventional light sources and are applied to various fields such as traffic lights, back light modules, street lighting, and biomedical device.

SUMMARY OF THE DISCLOSURE

The present disclosure provides a method for reusing a substrate for making light-emitting devices. The method comprises the steps of providing a substrate, forming a nucleation layer on the substrate, forming a semiconductor stack on the nucleation layer, and separating the semiconductor stack from the nucleation layer to expose the nucleation layer.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
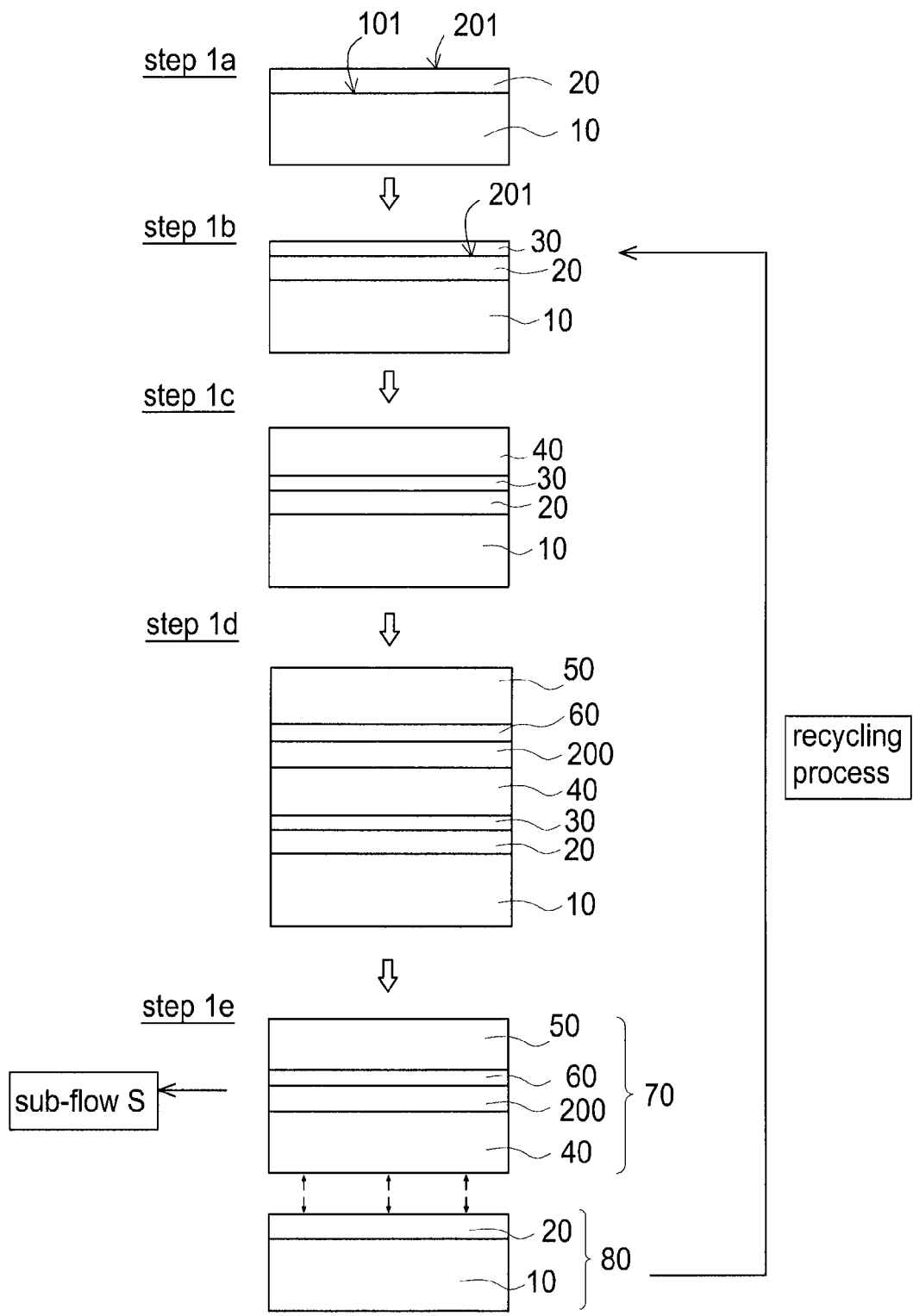
FIG. 1 is a schematic process flow for manufacturing a light-emitting device in accordance with the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present application, if not specifically mention, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; the general expression of InGaP means $In_xGa_{1-x}P$, wherein $0 \leq x \leq 1$; and the general expression of GaAsP means $GaAs_{1-x}P_x$, wherein $0 \leq x \leq 1$. The content of the element can be adjusted for different purposes, such as, but is not limited to, matching the lattice constant of the growth substrate or adjusting the dominant wavelength.

Figure 4:
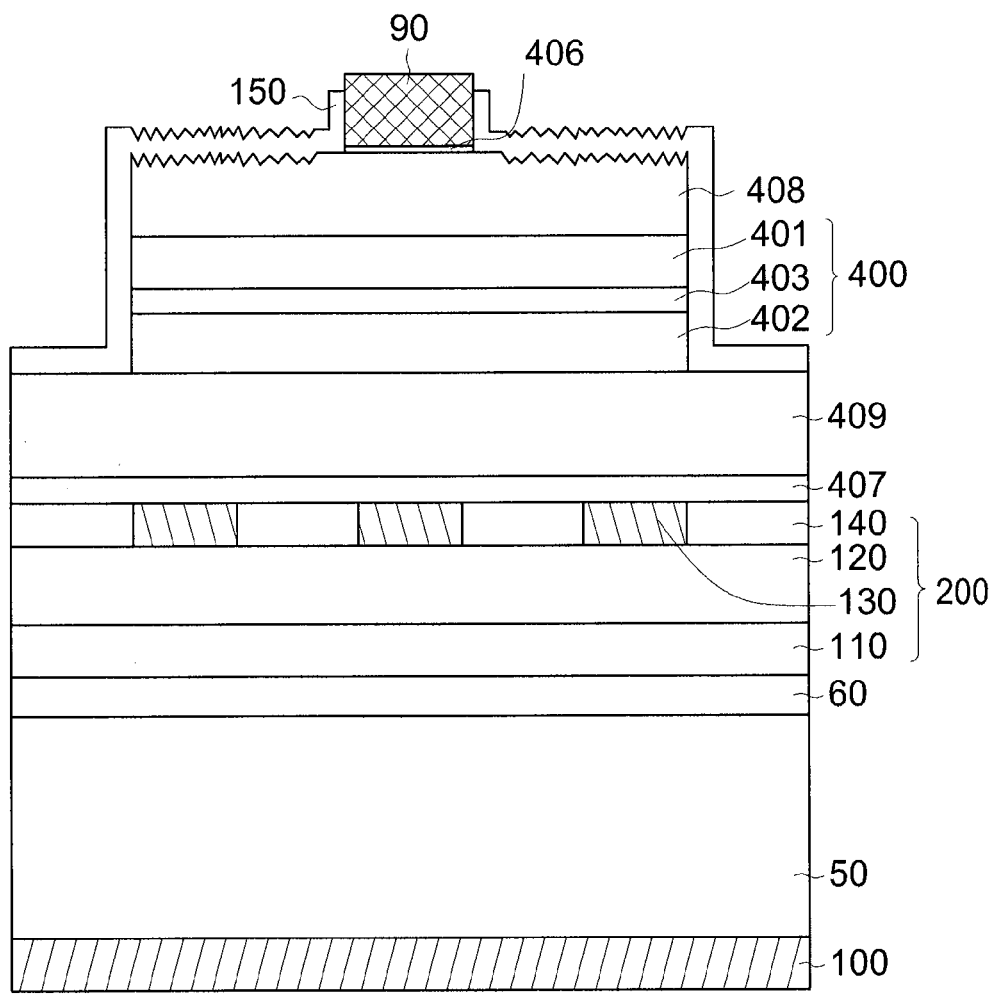
FIG. 4 is a cross-sectional diagram of the light-emitting device of one embodiment in accordance with the present application.

FIG. 1 is a schematic process flow for manufacturing a light-emitting device in accordance with the present application. The method for manufacturing the light-emitting device comprises the steps of:

step 1a: providing a growth substrate 10 comprising an upper surface 101; and forming a nucleation layer 20 on the upper surface 101 of the growth substrate 10 by epitaxial growth, wherein the nucleation layer 20 comprises an top surface 201;

step 1b: forming a sacrificial layer 30 on the top surface 201 of the nucleation layer 20 by epitaxial growth;

Step 1c: forming a semiconductor stack 40 by epitaxial growth on the sacrificial layer 30;

Step 1d: forming a reflecting system 200 on the semiconductor stack 40 and bonding a supporting substrate 50 to the reflecting system 200 by a bonding layer 60;

step 1e: separating the semiconductor stack 40 from the nucleation layer 20 by removing the sacrificial layer 30 by an etching solution to form a first intermediate structure 70 comprising the supporting substrate 50 and the semiconductor stack 40 bonded thereon and form a second intermediate structure 80 comprising the growth substrate 10 and the nucleation layer 20 grown thereon, wherein the first intermediate structure 70 follows a sub-flow S to form the light-emitting device as shown in FIG. 4 and will be described later;

Step 1f: treating the top surface 201 of the nucleation layer 20 by an acid solution for removing any undesirable contaminant or byproduct, such as native oxide oxidized from the nucleation layer 20, and then the second intermediate structure 80 follows a recycling process to repetitively form the semiconductor stack 40 by reusing the second intermediate structure 80 and cycling the step 1b through step 1e or the step 1b through step 1f and sub-flow S.

The method of performing epitaxial growth comprises, but is not limited to metal-organic chemical vapor deposition (MOCVD), hydride vapor phase epitaxial (HVPE) or liquid-phase epitaxy (LPE). In one embodiment, the nucleation layer 20 and the sacrificial layer 30 are all lattice matched to the growth substrate 10.

Specifically, referring to FIG. 1, the growth substrate 10 provides the upper surface 101 for epitaxially growing the nucleation layer 20, and the growth substrate 10 has a thickness thick enough for supporting the layers or the structures grown thereon. Preferably, the growth substrate 10 has a thickness not less than 100 µm, and preferably, not greater than 750 µm. The growth substrate 10 comprises a semiconductor material, for example, a Group III-V semiconductor material or a Group IV semiconductor material. In one embodiment, the growth substrate 10 comprises a Group III-V semiconductor material of a conductivity type. Preferably, the growth substrate 10 is substantially single crystal. In one embodiment, the growth substrate 10 comprises Ge. In the present embodiment, the Group III-V semiconductor material comprises GaAs of n-type conductivity. The n-type dopant comprises Si or Ge. In one embodiment, the growth substrate 10 has a plane inclined at an angle with respect to the (100) plane as a main growth surface. Preferably, the angle is between 2 degrees and 15 degrees both inclusive. The growth substrate 10 has a first intrinsic lattice constant. In the present application, if not specifically mention, the term "intrinsic lattice constant" means the lattice constant $a_0$ of a substantially unstrained layer.

Specifically, the nucleation layer 20 is directly formed on the upper surface 101 of the growth substrate 10 by epitaxial growth. In one embodiment, the nucleation layer 20 is permanently on the growth substrate 10 and covers the upper surface 101 of the growth substrate 10. The nucleation layer 20 provides a top surface 201 for repeatedly growing the subsequent layers, such as a sacrificial layer 30. The nucleation layer 20 comprises, or preferably, is substantially composed of a material different from that of the growth substrate 10. For example, in the present embodiment, the nucleation layer 20 is substantially composed of $(Al_y Ga_{(1-y)})_{1-x}In_xP$, wherein $0 \leq x \leq 1$, $0 \leq y \leq 1$. Preferably, the nucleation layer 20 is substantially composed of $(Al_y Ga_{(1-y)})_{1-x}In_xP$, wherein $0.4 \leq x \leq 0.6$, $0 \leq y \leq 0.6$. More preferably, the nucleation layer 20 is substantially composed of $(Al_y Ga_{(1-y)})_{1-x}In_xP$, wherein $0.49 \leq x \leq 0.51$, $0 \leq y \leq 0.6$ to inhibit Al from being oxidized when it is exposed to the atmosphere. The nucleation layer 20 has a second intrinsic lattice constant substantially the same as the first intrinsic lattice constant of the growth substrate 10. More preferably, the nucleation layer 20 is substantially composed of $In_xGa_{1-x}P$, which is substantially devoid of Al, wherein $0.49 \leq x \leq 0.51$. The term "devoid" means that the nucleation layer 20 does not substantially comprise, or comprises no more than a trace amount of Al. Because the nucleation layer 20 is substantially composed of $In_xGa_{1-x}P$, which is substantially devoid of Al, when the nucleation layer 20 is exposed to the atmosphere, the formation of the byproduct oxidized from Al can be significantly reduced. The nucleation layer 20 has a thickness not less than 3 nm for ensuring the quality of the subsequent epitaxial layers, and preferably, the nucleation layer 20 has a thickness between 10 nm and 1500 nm.

The sacrificial layer 30 is directly formed on the top surface 201 of the nucleation layer 20 by epitaxial growth. Preferably, the sacrificial layer 30 has a third intrinsic lattice constant substantially the same as the second intrinsic lattice constant of the nucleation layer 20. Preferably, the sacrificial layer 30 comprises a material having a different composition or a different composition ratio from that of the nucleation layer 20. The etching solution for removing the sacrificial layer 30 to separate the semiconductor stack 40 from the nucleation layer 20 has a first etching rate to the sacrificial layer 30 significantly higher than a second etching rate to the nucleation layer 20. Preferably, a ratio of the first etching rate to the second etching rate is greater than 100:1, preferably, greater than 1000:1. The etching solution is selective to mostly, and preferably, only remove the sacrificial layer 30. By using the etching solution having a high selectivity, the sacrificial layer 30 is completely removed while the nucleation layer 20 is substantially unaffected compared to the sacrificial layer 30 after the step 1e. In one embodiment, the sacrificial layer 30 comprises group III-arsenide. Preferably, the sacrificial layer 30 is substantially composed of ternary arsenide, e.g. $Al_xGa_{1-x}As$, and $0 \leq x \leq 1$. More preferably, the sacrificial layer 30 is substantially composed of binary arsenide, e.g. AlAs. The sacrificial layer 30 has a thickness not less than 10 nm for facilitating the separating step as in step 1e of FIG. 1, and preferably, not more than 1000 nm. If the sacrificial layer 30 has a thickness less than 10 nm, removing the sacrificial layer 30 in step 1e will take a relatively long time, which may result in damaging the crystal surface of the semiconductor stack 40. In one embodiment, the etching solution comprises HF, and the sacrificial layer 30 comprises AlAs, which is devoid of Ga, for increasing the selectivity of the etching solution.

Figure 2:
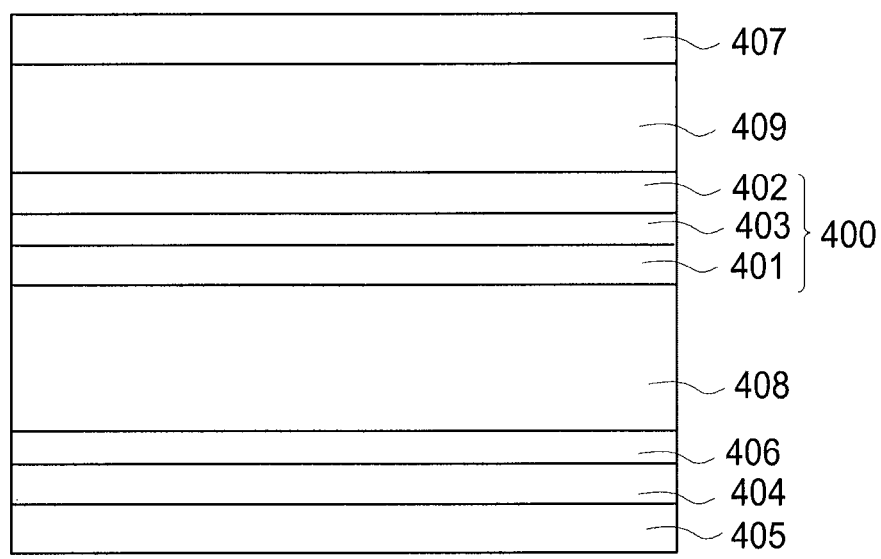
FIG. 2 is a cross-sectional diagram of the semiconductor stack in accordance with the present application.

FIG. 2 is a cross-sectional diagram of the semiconductor stack 40 in accordance with the present application. The semiconductor stack 40 comprises a light-emitting stack 400 comprising a first cladding layer 401 of n type for providing electrons, a second cladding layer 402 of p type for providing holes, and an active layer 403 between the first cladding layer 401 and the second cladding layer 402. The band gap of the first cladding layer 401 and the band gap of the second cladding layer 402 are both higher than the band gap of the active layer 403. The active layer 403 emits a radiation having a dominant wavelength. Preferably, the radiation is visible. The dominant wavelength is in red spectrum region, e.g., between 550 nm and 680 nm both inclusive. In one embodiment, the semiconductor stack 40 comprises an etching stop layer 404 directly formed on the sacrificial layer 30 by epitaxial growth before forming the light-emitting stack 400. The etching stop layer 404 comprises a material having a different composition or a different composition ratio from that of the sacrificial layer 30 and having an etching rate much lower than the etching rate of the sacrificial layer 30 to the etching solution for the separating step 1e in FIG. 1. The ratio of the etching rate of the material of the sacrificial layer 30 to the etching rate of the material of the etching stop layer 404 to the etching solution for the separating step 1e in FIG. 1 is greater than 100:1, preferably, greater than 1000:1. In one embodiment, the etching stop layer 404 comprises a material the same as the nucleation later 20. The etching stop layer 404 has a thickness not less than 10 nm, and preferably, not more than 300 nm. In the present embodiment, the etching stop layer 404 comprises, or preferably, is substantially composed of InGaP. In one embodiment, the semiconductor stack 40 comprises a buffer layer 405 directly formed on the sacrificial layer 30 by epitaxial growth and is formed before forming the etching stop layer 404. Therefore, the buffer layer 405 is between the sacrificial layer 30 and the etching stop layer 404. The buffer layer 405 comprises a material different from that of the sacrificial layer 30 and having an etching rate lower than the etching rate of the sacrificial layer 30 to the etching solution for the separating step 1e in FIG. 1. Preferably, the buffer layer 405 comprises a material having a different composition or a different composition ratio from that of the etching stop layer 404 and having an etching rate higher than the etching rate of the etching stop layer 404 to the etching solution for the separating step 1e in FIG. 1. The ratio of the etching rate of the sacrificial layer 30 to the etching rate of the buffer layer 405 to the etching solution for the separating step 1e in FIG. 1 is greater than 100:1, preferably, greater than 1000:1. In one embodiment, the buffer layer 405 comprises group III-arsenide, such as GaAs. The buffer layer 405 has a thickness not less than 10 nm, and preferably, not more than 300 nm.

Referring to FIG. 2, in one embodiment, the semiconductor stack 40 further comprises a first contact layer 406 formed between the etching stop layer 404 and the first cladding layer 401 by epitaxial growth and further comprises a second contact layer 407 formed on the second cladding layer 402 by epitaxial growth. The conductivity type of the first contact layer 406 is different from the conductivity type of the second contact layer 407. The first contact layer 406 and the second contact layer 407 are with high carrier concentration, such as greater than $10^{18}/cm^3$, and preferably, between $5*10^{18}/cm^3$ and $5*10^{19}/cm^3$ both inclusive. The material of the first contact layer 406 and the second contact layer 407 comprise a Group III-V semiconductor material, such as GaAs, AlGaAs, InGaP, GaP or AlGaInP.

Referring to FIG. 2, in one embodiment, the semiconductor stack 40 further comprises a first window layer 408 formed between the first contact layer 406 and the first cladding layer 401 by epitaxial growth and comprises a second window layer 409 formed between the second contact layer 407 and the second cladding layer 402 by epitaxial growth. The first window layer 408 and the second window layer 409 are for spreading current through the light-emitting stack 400. The thicknesses of the first window layer 408 and the thickness of the second window layer 409 are not less than 100 nm, and preferably, not greater than 8000 nm. The first window layer 408 and the second window layer 409 comprise a Group III-V semiconductor material, such as AlGaAs or AlGaInP.

The supporting substrate 50 is bonded to semiconductor stack 40 by the bonding layer 60. The supporting substrate 50 has a thickness thick enough for supporting the semiconductor stack 40 after the step 1e. Preferably, the supporting substrate 50 has a thickness not less than 100 m. In one embodiment, the supporting substrate 50 is a temporary substrate, which will be removed during the manufacturing process, and thus the finished light-emitting device will not comprise the supporting substrate 50. The temporary substrate comprises glass. In one embodiment, the supporting substrate 50 is a permanent substrate comprised in the finished light-emitting device. The permanent substrate comprises Si, Ge, Cu, Mo, MoW, AlN or ZnO, $Al_2O_3$. The bonding layer 60 comprises transparent conducive oxide, metal material, insulating oxide, or polymer. The transparent conducive oxide comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the alloys thereof. The insulating oxide comprises aluminum oxide ($AlO_x$), silicon oxide ($SiO_x$), or silicon oxynitride ($SiO_xN_y$). The polymer comprises epoxy, polyimide, perfluorocyclobutane, benzocyclobutene (BCB) or silicone. The bonding layer 60 has a thickness between 400 nm and 5000 nm.

In one embodiment, during the step 1f, the acid solution for removing any undesirable byproduct formed on the top surface 201 of the nucleation layer 20 comprises phosphoric acid ($H_3PO_4$), HCl or citric Acid. Specifically, the step 1f can be carried out under the atmosphere but without having any side effects on the nucleation layer 20. The step 1f significantly improves the quality of the semiconductor stack 40 grown afterwards by removing undesirable byproducts formed on the top surface 201 of the nucleation layer 20 to provide a crystal surface 201 substantially composed of crystal material, such as a single crystal semiconductor. As a result, the top surface 201 serves as a growth plane with good quality for growing the subsequent sacrificial layer 30 and the semiconductor stack 40.

The second intermediate structure 80 comprising the growth substrate 10 and the nucleation layer 20 is regarded as a reusable unit in wafer form for repeatedly growing the subsequent layers such the sacrificial layer 30 and the semiconductor stack 40, or another epitaxial structure emitting different dominant wavelength.

In one embodiment, the nucleation layer 20 may possibly be damaged by the step 1e and the step 1f during the recycling process, and thus the nucleation layer 20 is slightly thinned after a numerous cycles. The thinned nucleation layer 20 may result in unsatisfactory crystal quality of the semiconductor stack 40 grown afterwards. In this condition, the method of the present application further comprises a step of re-growing a new nucleation layer 20 on the residual nucleation layer 20 to a predetermined thickness. After re-growing the new nucleation layer 20, the new nucleation layer 20 and the residual nucleation layer 20 are regarded as an integrated nucleation layer 20 for the recycling process. In one embodiment, the step of re-growing the new nucleation layer 20 can be carried out before each cycle to ensure the quality of the subsequent epitaxial layers.

Figure 3:
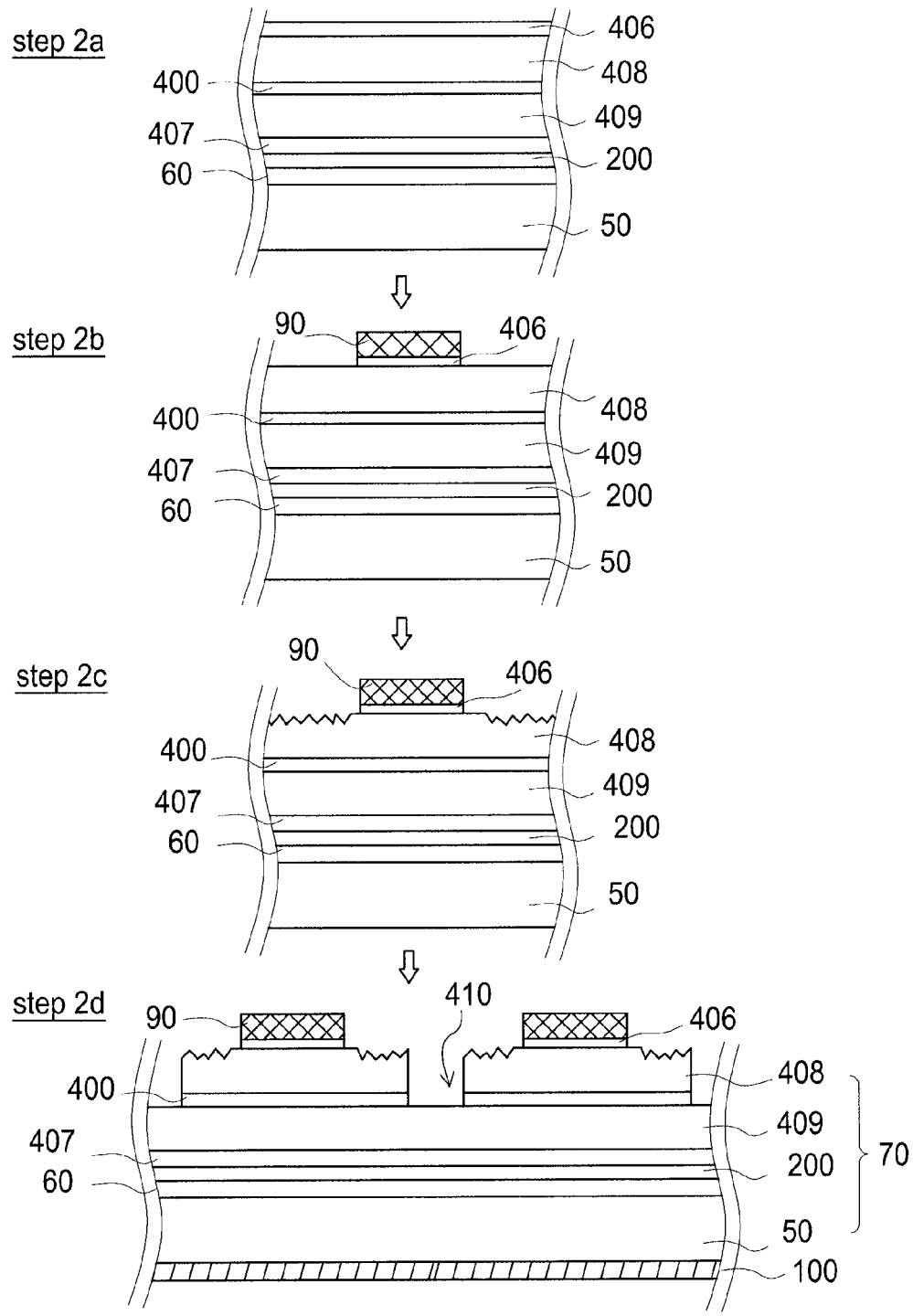
FIG. 3 is a schematic process flow of sub-flow S of FIG. 1.

FIG. 3 is a schematic process flow of sub-flow S of FIG. 1. The first intermediate structure 70 follows the sub-flow S to form the light-emitting device in accordance with one embodiment of the present disclosure, wherein the sub-flow S comprises the steps of:

step 2a: removing the buffer layer 405 and the etching stop layer 404 to expose the first contact layer 406;

step 2b: forming a first electrode 90 on the first contact layer 406 and patterning the first contact layer 406 and the first electrode 90 to expose a part of the window layer 408;

step 2c: optionally, roughing an exposed part of the first window layer 408 to form a rough surface;

step 2d: removing a periphery part of the light-emitting stack 400 and a periphery part of the first window layer 408 to form a plurality of dicing streets 410 on the second window layer 409, and forming a second electrode 100 on the bottom side of the supporting substrate 50; and step 2e: dicing the structure formed in the step 2d along the dicing streets 410 to obtain the multiple finished light-emitting devices as shown in FIG. 4.

FIG. 4 shows a cross-sectional diagram of the light-emitting device of one embodiment in accordance with the present application. Referring to FIG. 4, the first electrode 90 and the second electrode 100 are electrically connected to the first contact layer 406 and the second contact layer 407 respectively. The first electrode 90 and the second electrode 100 are for conducting a current therebetween. The first contact layer 406 forms an ohmic contact between the first electrode 90 and the light-emitting stack 400. The second contact layer 407 forms an ohmic contact between the second electrode 100 and the light-emitting stack 400. The material of the first electrode 90 and the second electrode 100 comprise transparent conductive material or metal material, wherein the transparent conductive material comprises transparent conductive oxide, and wherein the metal material includes Au, Pt, GeAuNi, Ti, BeAu, GeAu, Al, or ZnAu. In the present embodiment, the light-emitting device is a vertical-type LED, which means that the first electrode 90 and the second electrode 100 are on the opposite sides of the supporting substrate 50, and the supporting substrate 50 is electrically conductive for conducting a current flowing between the first electrode 90 and the second electrode 100. In the present embodiment, the bonding layer 60 between the supporting substrate 50 and the light-emitting stack 400 is for mechanically connecting the supporting substrate 50 to the light-emitting stack 400 and is electrically conductive.

Referring to FIG. 4, in the present embodiment, the reflecting system 200 is between the bonding layer 60 and the light-emitting stack 400 for reflecting the radiation emitted from the active layer 403 toward the front side of the light-emitting device, wherein the front side of the light-emitting device is the side where the first electrode 90 situates and is opposite to the rear side where the second electrode 100 situates. The reflecting system 200 comprises a conductive reflector 110 comprising a material with a reflectivity greater than 90% for the light emitted from the active layer 403. Preferably, the conductive reflector 110 comprises metal, such as Au, Ag, Al or the combinations thereof. The conductive reflector 110 has a thickness of between about 2500 Å and 7500 Å. The reflecting system 200 further comprises a current spreading layer 120 between the conductive reflector 110 and the second contact layer 407 for spreading current laterally. The material of the current spreading layer 120 comprises transparent conductive oxide comprising indium tin oxide (ITO), aluminum zinc oxide (AZO), SnCdO, antimony tin oxide (ATO), ZnO, $Zn_2SnO_4$ (ZTO) or indium zinc oxide (IZO). In the present embodiment, the current spreading layer 120 comprises IZO and is preferred formed by sputtering. The reflecting system 200 further comprises a transparent conductive layer 130 between the current spreading layer 120 and the second contact layer 407, and preferably, the transparent conductive layer 130 directly contacts the second contact layer 407 for reducing the series resistance between the second electrode 100 and the light-emitting stack 400. The transparent conductive layer 130 is preferred formed by e-beam evaporation and comprises transparent conductive oxide comprising indium tin oxide (ITO), aluminum zinc oxide (AZO), SnCdO, antimony tin oxide (ATO), ZnO, $Zn_2SnO_4$ (ZTO) or indium zinc oxide (IZO). The reflecting system 200 further comprises an insulation layer 140 between the current spreading layer 120 and the second contact layer 407. The pattern of the insulation layer 140 is complementary to the pattern of the transparent conductive layer 130. The insulation layer 140 has a refractive index less than 1.5, and preferably between 1.3 and 1.45. The difference of the refractive index between the second contact layer 407 and the refractive index of the insulation layer 140 is larger than 1.5. The reflecting system 200 forms an omnidirectional reflector (ODR) for reflecting the light emitted from the active layer 403. The reflectivity of the reflecting system 200 is larger than 95%, and preferably is larger than 97% for the light emitted from the active layer 403. The insulation layer 140 comprises $MgF_x$ or porous $SiO_x$. The light-emitting device further comprises a passivation layer 150 covering the exposed surface of the first window layer 408, a periphery wall of the light-emitting stack 400, and an exposed surface of the second window layer 409. The passivation layer 150 serves as a protection layer to protect the first window layer 408, the light-emitting stack 400 and the second window layer 409 from environment damage, such as moisture, or mechanical damage.

Figure 5:
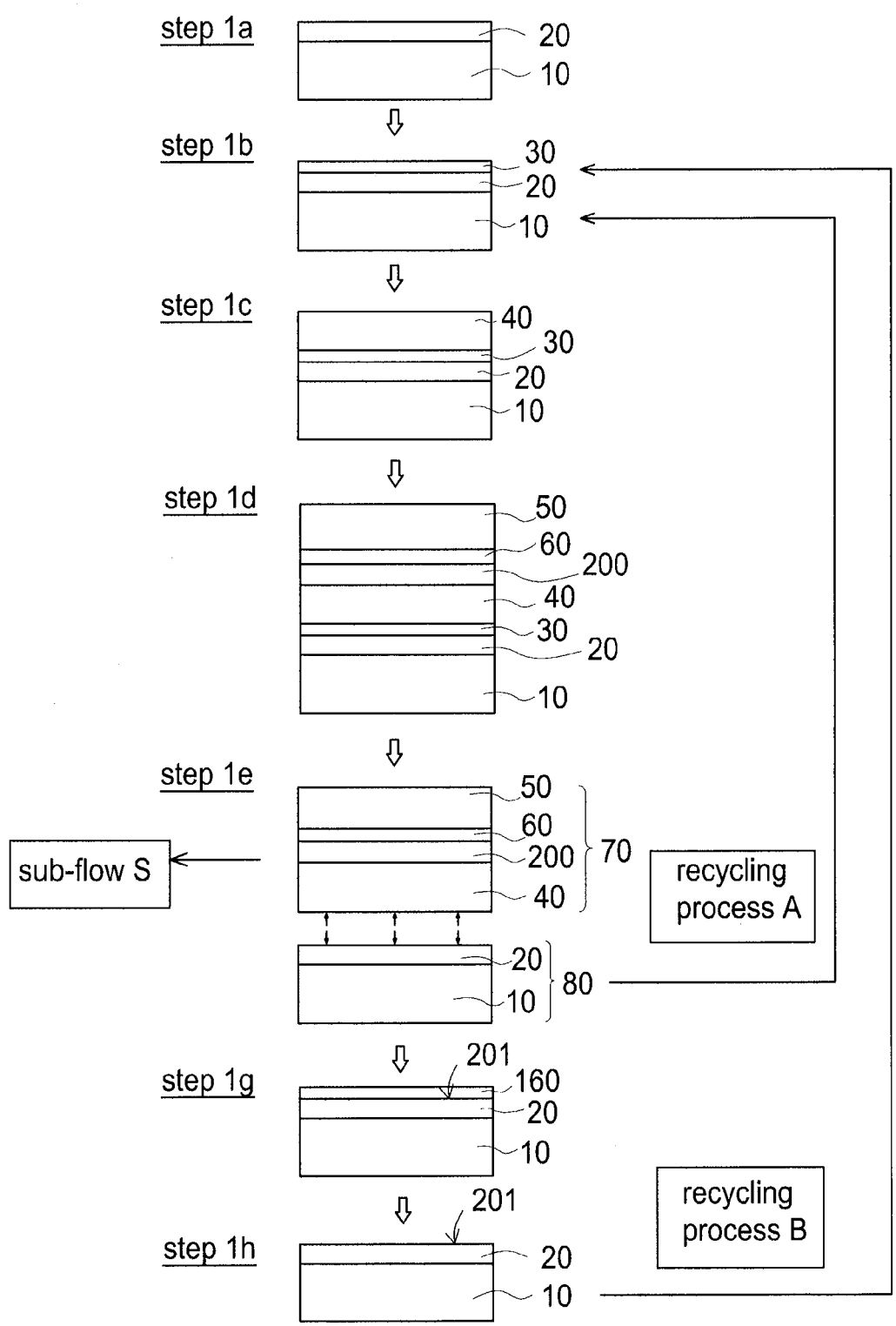
FIG. 5 is a schematic process flow for manufacturing a light-emitting device of another embodiment in accordance with the present application.

FIG. 5 is a process flow for manufacturing a light-emitting device of another embodiment in accordance with the present application. The method in accordance with the present embodiment comprises substantially the same steps as the steps 1a through 1e in the embodiment as shown in FIG. 1. The difference is that after the step 1e or after the step 1f, the method in accordance with the present embodiment may further comprises step 1g of forming a protecting layer 160 on the top surface 201 of the nucleation layer 20 and step 1h of removing the protecting layer 160 to expose the top surface 201 of the nucleation layer 20. In the present embodiment, after the step 1e or after the step 1f, the second intermediate structure 80 is queued for cycling the steps 1b through 1e for forming the semiconductor stack 40 or another epitaxial structure. 1f the queue time is over a predetermined time period, the protecting layer 160 is formed for preventing the nucleation layer 20 from contaminating or forming byproduct, such as native oxide formed on the top surface 201 of the nucleation layer 20 from the atmosphere. The protecting layer 160 comprises a material having a different composition or a different composition ratio from that of the nucleation layer 20. The etching solution for removing the protecting layer 160 has a first etching rate to the protecting layer 160 higher than the second etching rate to the nucleation layer 20. A ratio of the first etching rate to the second etching rate is greater than 100:1, preferably, greater than 1000:1. Specifically, after the step 1h, the protecting layer 160 is completely removed while the nucleation layer 20 is substantially unaffected. Specifically, the etching solution is selective to mostly, or preferably, only remove the protecting layer 160 while substantially without damaging the crystal surface of the nucleation layer 20. In one embodiment, the etching solution comprises a mixture of citric acid and $H_2O_2$ or a mixture of $H_2O_2$ and $NH_4OH$. The protecting layer 160 comprises group III-arsenide comprising GaAs, AlAs, or AlGaAs. In the present embodiment, the nucleation layer 20, the protecting layer 160, and the sacrificial layer 30 are all lattice matched to the growth substrate 10. The protecting layer 160 has a thickness not less than 10 nm, and preferably, not more than 500 nm. In one embodiment, the protecting layer 160 comprises multiple layers. Specifically, every two adjacent layers comprise different materials. For example, in one embodiment, the protecting layer 160 comprises a first sub-layer comprising GaAs, a second sub-layer on the first sub-layer and comprising AlAs, and a third sub-layer on the second sub-layer and comprising GaAs. Preferably, the first sub-layer of the protecting layer 160, which is directly formed on the nucleation layer 20, is devoid of Al for reducing the possibility of undesirable reactions occurring between the nucleation layer 20 and the first sub-layer.

In one embodiment, the method may further comprise step 1i of treating the top surface 201 of the nucleation layer 20 by wet etching after the step 1h. Referring to FIG. 5, in the present embodiment, the method comprises recycling process B demonstrating the second intermediate structure 80 being recycled for repetitively forming the semiconductor stack 40 or another epitaxial structure by cycling the steps 1b through 1h and the sub-flow A. In the present embodiment, the second intermediate structure 80 can proceed with either the recycling process A or the recycling process B.

In one embodiment, forming a reflecting system 200 on the semiconductor stack 40 in step 1d is optional.

The present invention provides a cost-effective method for making light-emitting devices by using the recycled growth substrate 10 and the nucleation layer 20. Besides, the light-emitting device made by the method has good performances and high reproducibility.

In one embodiment, the light-emitting device can be a light-emitting diode emitting incoherent light. Therefore, the light-emitting device has a far field angle greater than 70 degrees. In one embodiment, the far field angle is greater than 90 degrees. In one embodiment, the light-emitting device can be a light-emitting laser emitting coherent light. Therefore, the light-emitting laser has a far field angle less than 40 degrees. In one embodiment, the far field angle is less than 30 degrees.

In one embodiment, the structure of the active layer 403 can be single heterostructure (SH), double heterostructure (DH), double-side double heterostructure (DDH) or multi-quantum well (MQW). In the present embodiment, the structure of the active layer 403 comprises Multiple Quantum Well (MQW). Specifically, the active layer 403 comprises alternate well layers and barrier layers. The band gaps of the barrier layers are higher than the band gaps of the well layers. The band gaps of the barrier layers are lower than the band gap of the first cladding layer 401 and the band gap of the second cladding layer 402. The dominant wavelength of the light emitted from the active layer 403 can be changed by adjusting the thicknesses and the material of the well layers. Preferably, the material of the well layers comprises a Group III-V semiconductor material, such as InGaAs or AGIP. The material of the barrier layers comprises a Group III-V semiconductor material, such as AlGaAs, AGIP or GaAsP.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A method for reusing a substrate for making a light-emitting device, comprising the steps of:
   (a) providing a substrate;
   (b) forming a nucleation layer on the substrate;
   (c) forming a semiconductor stack on the nucleation layer; and
   (d) separating the semiconductor stack from the nucleation layer to expose the nucleation layer; wherein the method further comprises a step of forming a sacrificial layer on the nucleation layer before the step (c), and the sacrificial layer comprises group III-arsenide.

2. The method according to claim 1, wherein the sacrificial layer has a thickness between 10 nm and 1000 nm.

3. The method according to claim 1, wherein the sacrificial layer comprises $Al_xGa_{1-x}As$, and $0 \leq x \leq 1$.

4. The method according to claim 1, wherein the step of separating the semiconductor stack from the nucleation layer to expose the nucleation layer is by removing the sacrificial layer.

5. The method according to claim 4, wherein the step of removing the sacrificial layer is by using a solution comprising HF.

6. The method according to claim 1, further comprising a step of treating a top surface of the nucleation layer after the step (d).

7. The method according to claim 5, wherein the step of treating the top surface of the nucleation layer is by using an acid solution to remove byproducts formed on the top surface of the nucleation layer.

8. The method according to claim 1, further comprising a step of forming a protecting layer on the nucleation layer after the step (d).

9. The method according to claim 8, further comprising a step of removing the protecting layer to expose the nucleation layer.

10. The method according to claim 8, wherein the protecting layer comprises multiple layers.

11. The method according to claim 9, further comprising a step of treating an exposed surface of the nucleation layer after the step of removing the protecting layer.

12. The method according to claim 11, wherein the step of treating the surface of the exposed surface of the nucleation layer is by using an acid solution.

13. The method according to claim 10, wherein the step of removing the protecting layer is by using a solution comprising a mixture of $H_2O_2$ and $NH_4OH$ or a mixture of citric acid and $H_2O_2$.

14. The method according to claim 9, wherein the protecting layer comprises a group III-arsenide.

15. The method according to claim 1, further comprising repeating the steps of (c) through (d).

16. The method according to claim 1, wherein the nucleation layer comprises $(Al_yGa_{(1-y)})_{1-x}In_xP$, wherein $0 \leq x \leq 1$, $0 \leq y \leq 1$.

17. The method according to claim 1, wherein the nucleation layer comprises $(Al_yGa_{(1-y)})_{1-x}In_xP$, wherein $0.4 \leq x \leq 0.6$, $0 \leq y \leq 0.6$.

18. The method according to claim 1, wherein the nucleation layer has a thickness between 3 nm and 1500 nm.

19. A method for reusing a substrate for making a light-emitting device, comprising the steps of:
   (a) providing a substrate;
   (b) forming a nucleation layer on the substrate;
   (c) forming a semiconductor stack on the nucleation layer; and
   (d) separating the semiconductor stack from the nucleation layer to expose the nucleation layer; wherein the nucleation layer comprises $(Al_yGa_{(1-y)})_{1-x}In_xP$, wherein $0 \leq x \leq 1$, $0 \leq y \leq 1$.

20. The method according to claim 19, wherein the nucleation layer comprises $(Al_yGa_{(1-y)})_{1-x}In_xP$, wherein $0.4 \leq x \leq 0.6$, $0 \leq y \leq 0.6$.

* * * * *